United States Patent [19]

McGroddy et al.

[11] 4,052,272
[45] Oct. 4, 1977

[54] METHOD OF DEPOSITING METAL CONDUCTING PATTERNS ON LARGE AREA SURFACES

[75] Inventors: James Cleary McGroddy, Putnam Valley; Bruce Albert Scott, Pleasantville, both of N.Y.

[73] Assignee: International Business Machines Corporation, Armonk, N.Y.

[21] Appl. No.: 755,888

[22] Filed: Dec. 30, 1976

[51] Int. Cl.² .................... C25D 5/02; C25D 5/54; G03G 13/22
[52] U.S. Cl. .................... 204/15; 96/1.5 R; 96/1 E; 204/18 PC
[58] Field of Search .................... 204/15, 18 PC, 18 R; 96/1 E, 1 PC, 48 PD, 1.5

[56] References Cited

U.S. PATENT DOCUMENTS

| | | | |
|---|---|---|---|
| 3,220,939 | 11/1965 | Reithel | 204/18 PC |
| 3,436,468 | 4/1969 | Haberecht | 204/30 |
| 3,565,613 | 2/1971 | Tamai et al. | 96/1 E |
| 3,748,109 | 7/1973 | Lee | 204/15 |
| 3,791,340 | 2/1974 | Ferrara | 96/88 |

*Primary Examiner*—T. M. Tufariello
*Attorney, Agent, or Firm*—Hansel L. McGee

[57] ABSTRACT

A method of depositing conducting patterns on a large area surface is disclosed. The method is characterized by photochemically depositing an electrically conducting organic $\pi$-electron donor compound on an insulating surface and selectively depositing a metal onto the established conductive pattern while simultaneously removing the organic film.

6 Claims, No Drawings

METHOD OF DEPOSITING METAL CONDUCTING PATTERNS ON LARGE AREA SURFACES

BACKGROUND OF THE INVENTION

1. Field of the Invention

The present invention provides a method of and materials for depositing thin highly conducting lines on large area insulating substrates.

2. Prior Art

The printed circuit art is replete with methods of obtaining conducting lines on insulating substrates. Attempts to obtain high density circuitry have used any of a number techniques from vacuum deposition to voltaically depositing metals. Another art requiring thin conducting lines in high density over large areas is the gas panel technology. Commonly used techniques are either those used in the printed circuit technology or screening techniques.

None of the foregoing references relate to processes directed to depositing a metal on a substrate employing photochemical steps in order to produce conductive lines for the selective electrodeposition of a metal. Moreover, none of the references which we have developed teaches the use in depositing a metal on a substrate of π-donor compounds similar to those which are the subject of the present invention.

The Tamai et al patent (U.S. Pat. No. 3,565,613) relates to a reproduction process in which a photoconductive layer consisting of zinc oxide powders uniformly depersed in an insulating resin is image-wise exposed to form latent images. The latent images consist of the electroconductive difference between the exposed and unexposed areas. After exposure, the latent images are subjected to electrolysis in an electrolyte bath containing a material capable of forming visible images by an oxidation or reduction process, and does not involve the deposition of a metal on the substrate. The materials contemplated for reaction with the latent image are dyes capable of undergoing oxidation reduction type reactions. In contrast, the deposition of π-donor salts produces electrical conductivity in the exposed areas of the substrate.

The Reithel patent (U.S. Pat. No. 3,220,939) also relates to an electrolytic reproduction process described as in the Tamai patent.

Haberecht (U.S. Pat. No. 3,436,468) relates to a method of depositing a metal on a substrate. In accordance with the teachings of Haberecht, the substrate is coated with a polymer which is subsequently exposed to an electron beam. The electron beam decomposes the polymer to alter its chemical structure in selected paths. When the substrate is contacted with an electrolytic solution, the metal deposits onto the path of decomposed polymers that have been exposed to the electron beam. The patent does not clearly indicate the bases for the deposition, however, it appears that the path of decomposed polymer exhibits a lower resistance during electrodeposition.

Ferrara (U.S. Pat. No. 3,791,340) discloses a method of depositing a metal pattern on a surface of a substrate. The surface of the substrate is sensitized with a photosensitive palladium sensitizer or catalyst. The sensitized surface is exposed to ultraviolet radiation to delineate an unexposed pattern corresponding to the desired metal pattern. The palladium sensitizer in its initial state is capable of participating in electrodeposition, but upon exposure, the palladium sensitizer is rendered incapable of such participation. Upon immersing the exposed surface in a suitable electroless metal deposition solution, deposition occurs only in the areas of the unexposed palladium sensitizer.

Lee (U.S. Pat. No. 3,748,109) relates to a process for producing printed circuits, wherein a metal phosphorus compound is selectively formed on a substrate, using a photomask. The metal phosphorus compound is in the low oxidation state so that the substrate can be subjected to electroless or electrolytic treatment in order to deposit metal at the location of the metal phosphorus compound.

A method for optically printing conductive characters using organic π-electron donor compounds is disclosed in copending Application Ser. No. 591,992 to Edward M. Engler, Frank Kaufman and Bruce A. Scott and assigned to the same assignee as the present invention.

It is disclosed therein the organic "charge transfer" compounds which are low ionization potential donors and their charge transfer salts formed by oxidation with organic acceptors, when deposited from an halogenated hydrocarbon solvent and radiated with active radiation provided highly conducting images. Examples of organic π-electron donor compounds disclosed therein includes tetrathiafulvalene (TTF) tetraselenafulvalene (TSeF); Dithiadiselenafulvalene (DTDSeF), hexamethylene-tetrathiafulvalene, tetramethylene tetrathiafulvalene (TMTTF), tetrathiatetracene and the like. Generally the method dislosed in the aforementioned application included the steps of depositing the organic π-electron donor compound upon a substrate from a halogenated hydrocarbon (halocarbon) solution thereof. The deposited compound is then irradiated by actinic radiation in a predetermined pattern to give a colored, highly conductive image. It should be understood that the method of Application of Ser. No. 591,992 is incorporated herein by reference.

SUMMARY OF THE INVENTION

The present invention teaches a method of depositing fine conducting lines on large area surfaces. The method can be used in the fabrication of printed circuitry and in the fabrication of gas panels where there is a requirement for high density circuits over large areas.

The method of the present invention includes the steps of:

1. photochemically depositing a π-electron donor salt onto a substrate to form a conductive pattern and thereafter 2. selectively depositing a metal on said conductive pattern while simultaneously effecting the dissolution of said donor compound.

Compositions used in the present invention are of the type (Donor) $X_n$ where the donor is typically selected from TTF, TSeF, DSeDTF and their substituted derivatives, where X is selected from F, BR, Cl and I and $n < 1$. These compositions have conductivities in the range $\sigma(RT) = 10$–$500$ $(\Omega$-cm$)^{-1}$ in single crystal form. The compositions are non-stoichimetric having a range between $0.5 < n < 1$, which is a necessary condition for high conductivity. For example, the non-stoichiometric organic conductor (TTF) $Cl_{0.68}$ is produced according to the reaction:

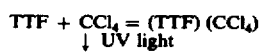

-continued

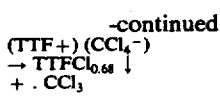

These compositions can be deposited upon a variety of substrate materials, e.g., glass, ceramics, polymeric materials paper and the like. When deposited on such insulating materials a large ($10^8 - 10^{16}$) difference in conductivity is created between the printed line or character and its supporting insulating matrix.

Light having wavelengths typically in the range of 3000–4000A is used. These wavelengths fall within the charge transfer (CT) band spectral region and causes the photo-oxidation of the donor compounds. Activation may also occur outside of the CT band when sensitizers are used. Such sensitizers include visible light-absorbing dyes such as Rhodamine B, Rose Bengal, methylene blue, and aromatic-type hydrocarbons such as anthracene, naphtalene, pyrene and the like. The light source may be broad band. For example, sunlight can be used so long as there is a UV component, i.e., wavelengths between 3000–4000°A.

This invention may be effected by using donors of the empirical formula $C_6H_4X_4R_4$ and having the structural formula

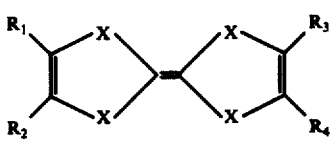

where X=O, S, Se and Te or any combination thereof. The R groups may be any organic substituent including hydrogen, alkyls, such as methyl and ethyl, phenyls, substituted phenyls, —SCH$_3$, —CO$_2$Me, halogen, fused cyclics in which the substituent effectively connects R1 with R2 and R3 with R4, e.g.

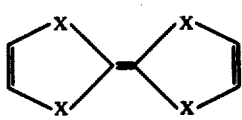

The following fused rings, such as cyclopentene, cyclohexene, benzene, furan, thiophene, dihydrofuran and dihydrothiophene, and derivatives thereof can be used. In addition, tetrathiatetracene, e.g.

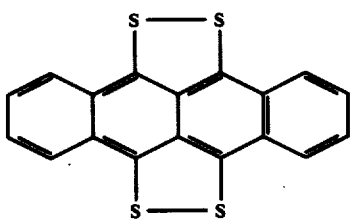

and their derivatives are also suitable for the purposes of this invention. In general, organic π-electron donors having low ionization potentials and which forms self-stacking conducting transfer salts can be used.

The halocarbon complexing agent can be selected from most chlorinated or brominated hydrocarbon where there is at least 1 carbon to halogen bond. Typical halocarbons are chloroform, bromoform, carbon tetrachloride, carbon bromide, methyl chloride, methyl bromide, ethyl chloride, ethyl bromide and the like.

The halocarbon complexing agent may be present as a component in the solution with other organic solvents, for example, chloroform, acetone, alcohol, chlorobenzene, etc., or may comprise the solvent entirely. Concentrations of the donor and halocarbon may range widely with the optimum concentration being $10^{-5}$ molar to 1 molar in donor concentration. A large excess of the halocarbon is preferred. Maximum sensitivity is obtained by illuminating the composition in the charge transfer bands of the particular composition selected.

Metals which are obtainable as water soluble salts can be electrolytically plated. For example, such metals as Ag, Cu, Al, Pt, Ni, Co, Fe and the like. The metals are obtained from their salts in solution and are deposited by application of an applied potential.

Following deposition of the conductive pattern using a photomask, projected image or a scanned light beam, the substrate containing the thin organic conducting film is immersed in a plating bath containing a salt of the metal whose deposition is desired. Metal is observed to deposit on the required pattern with the simultaneous removal of the organic film.

It has been discovered that with the deposition of the metal there is a simultaneous dissolution of the organic conducting film. Thus, the metal is deposited directly on the insulating substrate and is not a composite of metal film and organic conducting film. This results in greater adherence of the metal films to the substrate than could be obtained if the metal is disposed on the organic film. The simultaneous dissolution of the organic film during metal deposition is indeed unusual and unexpected. As is the high adherence of the metal film to the substrate.

EXAMPLE

The following example is by way of illustration and not by way of limitation.

A solution containing of 200 mg of TTF dissolved in CCl$_4$ is deposited on a glass substrate and is exposed to UV light having a wavelength of about 3650° A from a mineral lamp. The solution is irradiated for about 5 minutes to precipitate a dark red solid film in a predetermined pattern. The substrate with the dark red film (TTFCl$_{0.77}$) is immersed into a 0.5M agueous solution of AgNO$_3$ (pH = 12 by adjustment with NH$_3$). A one volt potential is applied between the film and a platinum anode. After 5 minutes from about 1000A to 2000A of silver metal was deposited with the elimination of the dark red film. The substrate and metal pattern was subjected to analysis by X-ray diffraction. The analysis did not disclose the presence of the TTFCl$_{0.77}$ deposit.

Major advantages of this invention is the ability to directly produce fine conducting lines on insulating substrates. It eliminates such costly operations as vacuum evaporation, screening and conventional photolithography and electron beam exposure as well as the inherent shortcomings of such processes as screeening.

While the invention has been described showing only a single layer of conductive patterns it should be obvious that additional layers and more complex conductive patterns using the same or different metals can be obtained by obvious modifications of the present invention.

What is claimed is:

1. A method for depositing metal conducting patterns on large area surfaces including the steps of:

a. photochemcially depositing organic π-electron donor-halide salt onto a substrate in a predetermined pattern and
b. simultaneously electrolytically depositing a metal film according to said predetermined pattern while removing said organic π-electron donor halide salt.

2. A method according to claim 1 wherein said organic π-electron donor-halide salt is composed a compound having the structural formula

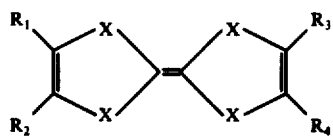

wherein X can be O, S, Se, or Te and $R_1$, $R_2$, $R_3$, and $R_4$ can be the same or different and is a groupd selected from hydrogen, alkyls phenyls, substituted phenyls, $-SCH_3$, $-CO_2Me$, halogen, and fused cycles, and a halocarbon.

3. A method according to claim 2 wherein said organic π-electron donor compound has the structural formula, where $R_1 = R_2 = R_3 = R_4$ and is hydrogen and X is S.

4. A method according to claim 2 wherein said π-electron donor compound has the structural formula where $R_1 = R_2 = R_3 = R_4$ and is hydrogen and X is Se.

5. A method according to claim 2 wherein said fused rings are selected from the group consisting of cyclopentane, cyclohexane, benzene, furan, thiophene, dihydrofuran, and dihydrothiphene.

6. A method according to claim 1 wherein said organic π-electron donor compound is tetrathiatetracene.

* * * * *